(12) United States Patent
Sage

(10) Patent No.: US 9,103,861 B2
(45) Date of Patent: Aug. 11, 2015

(54) MULTI-FUNCTION SENSOR AND METHOD

(71) Applicant: METHODE ELECTRONICS, INC., Chicago, IL (US)

(72) Inventor: Ian Sage, Southfield, MI (US)

(73) Assignee: METHODE ELECTRONICS, INC., Chicago, IL (US)

( * ) Notice: Subject to any disclaimer, the term of this patent is extended or adjusted under 35 U.S.C. 154(b) by 117 days.

(21) Appl. No.: 14/052,212

(22) Filed: Oct. 11, 2013

(65) Prior Publication Data

US 2014/0035600 A1 Feb. 6, 2014

Related U.S. Application Data

(63) Continuation of application No. 13/089,951, filed on Apr. 19, 2011, now Pat. No. 8,558,561.

(60) Provisional application No. 61/325,651, filed on Apr. 19, 2010.

(51) Int. Cl.
*G01R 27/26* (2006.01)
*H03K 17/96* (2006.01)

(52) U.S. Cl.
CPC ........ *G01R 27/2605* (2013.01); *H03K 17/9622* (2013.01)

(58) Field of Classification Search
CPC . G01R 27/26; G01R 27/2605; H03K 17/9622
USPC ................ 324/614, 615, 600, 515, 521, 530; 327/517, 269, 261–264, 270, 276–278; 345/713, 157–174
See application file for complete search history.

(56) References Cited

U.S. PATENT DOCUMENTS

| | | | |
|---|---|---|---|
| 2006/0238385 A1 | 10/2006 | Steenwyk et al. |
| 2009/0027068 A1 | 1/2009 | Philipp et al. |
| 2010/0052769 A1 | 3/2010 | Yamaguchi |
| 2012/0081332 A1 | 4/2012 | Atsuta et al. |

FOREIGN PATENT DOCUMENTS

GB 2418741 4/2006

OTHER PUBLICATIONS

Int'l Search Report and Written Opinion issued in application No. PCT/US2011/033027 (2011).
"Capacitive Sensing Designs Made Easy", Cypress Semiconductor Corp., pp. 1-25 (undated, but presumed to have been published at least as early as Apr. 18, 2010, in the United States by Cypress Semiconductor).

*Primary Examiner* — Melissa Koval
*Assistant Examiner* — Trung Nguyen
(74) *Attorney, Agent, or Firm* — Barnes & Thornburg LLP

(57) ABSTRACT

A multi-function sensor apparatus includes multiple sensing electrodes and a control circuit adapted to receive signals from each of the sensing electrodes and to deem whether the sensing electrodes are in a touched state or an untouched state. The control circuit also is adapted to selectively provide an output based on the sensor's states and the manner in which the sensors came to be in such states.

10 Claims, 3 Drawing Sheets

MULTI-FUNCTION SENSOR AND METHOD

CROSS-REFERENCE TO RELATED APPLICATION

This application is a continuation under 35 U.S.C. §120 of U.S. application Ser. No. 13/089,951, filed Apr. 19, 2011, which claims priority to U.S. Provisional Application No. 61/325,651, filed Apr. 19, 2010. The disclosures set forth in the foregoing applications are incorporated herein by reference in their entireties.

BACKGROUND OF THE INVENTION

Some automobiles have entry systems including electrically-operated door locks and latches. These locks and latches typically are operated by a number of electromechanical switches and/or electronic sensors located in or on the door handle. Each of the switches or sensors performs a single function. For example, one sensor might control the door latch. This sensor would cause the door latch to release when the sensor detects the presence of a user's hand on the handle, thereby allowing the user to pull the door open. This sensor typically would be associated with an outwardly-facing surface of the handle or on an inwardly-facing surface of the handle, between the handle and the door skin. Another sensor might control the door locks, causing them cycle between the locked and unlocked states in response to a user's touch. This sensor typically would be associated with another portion of the door handle, for example, the front or rear portion of an outwardly-facing surface of the handle. Alternatively, two sensors could be provided to control the door lock, one causing the door to lock in response to a user's touch and the other causing the door to unlock in response to a user's touch.

DETAILED DESCRIPTION OF THE DRAWINGS

FIGS. 1A-1B and 2A-2B illustrate an embodiment of a door handle 10 mounted on a door 12 of a vehicle. Door handle 10 is of a form that could readily be grasped by a user. Door handle 10 bears two sensing electrodes E1, E2 (shown in phantom) in the form of thin, conductive electrode pads. Sensing electrodes E1, E2 are disposed within door handle 10 in a manner that allows them to detect a hand, finger, or other object through the door handle and other substrate upon which the sensing electrodes might be mounted, as would be understood by one skilled in the art. Preferably, the sensing electrodes are sized, shaped and arranged so that either sensing electrode E1, E2 could be substantially covered by a user's finger placed on an adjacent surface of the door handle and such that both sensing electrodes E1, E2 could be substantially covered by a user's hand, or portion thereof, grasping the door handle.

Figure 1A:
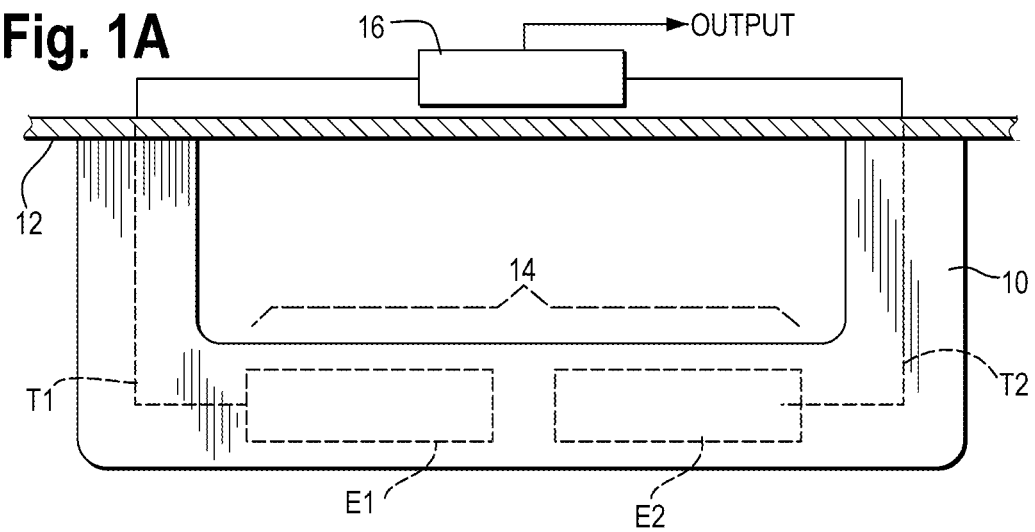
FIG. 1A is a plan view of a door handle 10 mounted on a vehicle door 12 and sensing electrodes E1, E2 disposed within door handle 10.
Figure 1B:
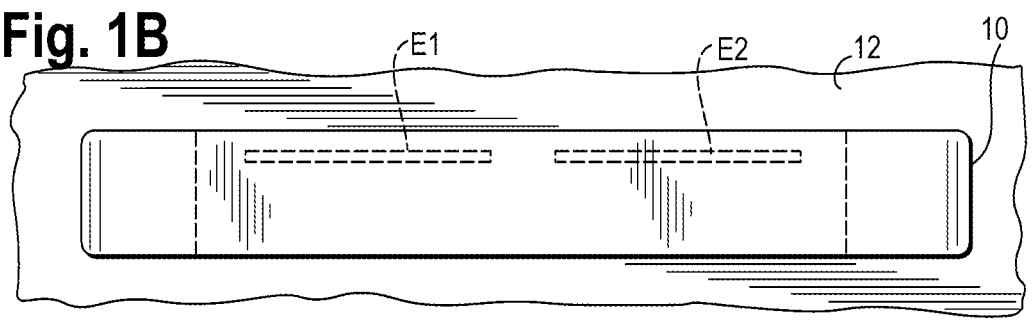
FIG. 1B is a side view of the door handle 10 of FIG. 1A mounted on vehicle door 12 and sensing electrodes E1, E2 disposed within door handle 10.

FIGS. 1A-1B show sensing electrodes E1, E2 disposed behind (that is, underneath) the upper surface of door handle 10. In this embodiment, sensing electrodes E1, E2 could be used to sense proximity or touch of a user's fingers, hand, or other object proximate the upper surface of door handle 10, as would be recognized by one skilled in the art and as discussed further below.

Figure 2A:
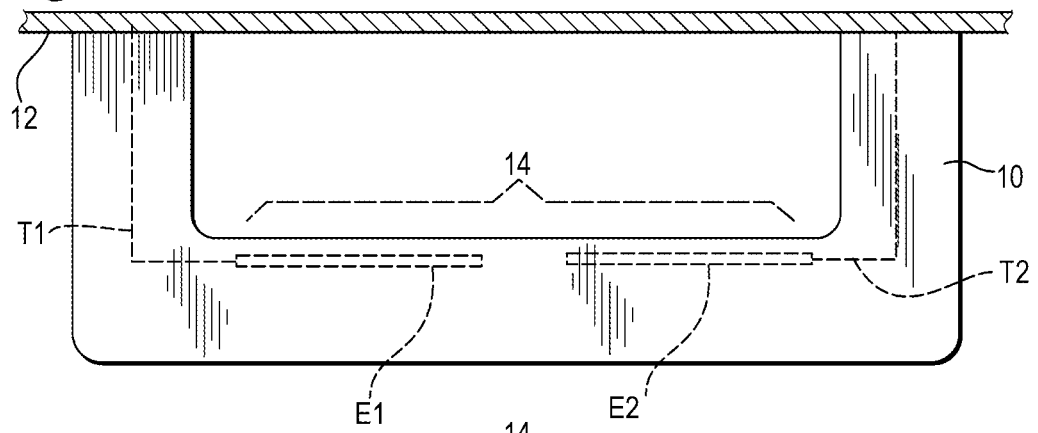
FIG. 2A is a plan view of another door handle 10 mounted on a vehicle door 12 and sensing electrodes E1, E2 disposed within door handle 10.
Figure 2B:
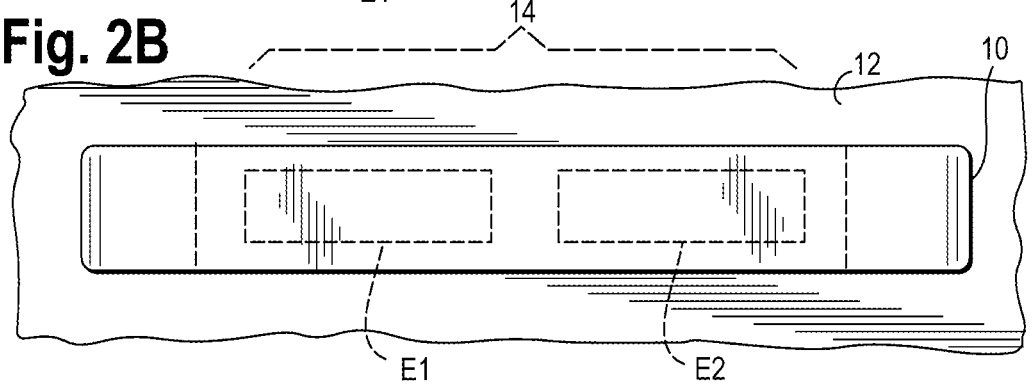
FIG. 2B is a side view of the door handle 10 of FIG. 2A mounted on vehicle door 12 and sensing electrodes E1, E2 disposed within door handle 10.

FIGS. 2A-2B show sensing electrodes E1, E2 disposed behind an inwardly-facing surface of door handle 10, that is, behind a surface of the door handle that faces door 12. In this embodiment, sensing electrodes E1, E2 could be used to sense proximity or touch of a user's fingers, hand or other object proximate the inwardly-facing surface of door handle 10.

In other embodiments, sensing electrodes E1, E2 could be disposed behind other surfaces of door handle 10. For example, sensing electrodes E1, E2 could be disposed behind a lower surface or outwardly-facing surface of door handle 10. In further embodiments, either or both of sensing electrodes E1, E2 could be disposed behind more than one surface of door handle 10. For example, either or both of sensing electrodes E1, E2 could have a first portion disposed underneath the upper surface of door handle 10 and a second portion disposed behind the inwardly-facing surface of door handle 10.

Although FIGS. 1A-1B and 2A-2B show, and the foregoing text describes, sensing electrode E1 disposed behind the same surface of door handle 10 as sensing electrode E2, the two sensing electrodes could be disposed behind different surfaces of door handle 10. For example, sensing electrode E1 could be disposed behind the upper surface of door handle 10, as shown in FIGS. 1A-1B, and sensing electrode E2 could be disposed behind the inwardly-facing surface of door handle 10, as shown in FIGS. 2A-2B.

Although sensing electrodes E1, E2 are shown as substantially conforming to the surfaces they are disposed behind, they need not be configured as such. For example, some portions of sensing electrodes E1, E2 could be nearer the surface(s) of door handle 10 they are disposed behind than other portions thereof.

In alternate embodiments, at least portions of sensing electrodes E1, E2 could be disposed on the surface of door handle 10, rather than within door handle 10. In such embodiments, a protective material could overlie the portions of sensing electrodes E1, E2 disposed on the surface of door handle 10 to protect them from physical damage and from the environment generally.

Sensing electrodes E1, E2 could be electrically coupled by respective electrical traces T1, T2 or other means to a control circuit (sometimes referred to herein as a "controller") 16 to form a multi-function sensor apparatus. Control circuit 16 could be embodied in discrete hardware form or, for example, as a Cypress Semiconductor PSOC or equivalent controller programmed with software algorithms to support the performance of the functions described below and/or other desired functions.

Control circuit 16 could be adapted to provide excitation signals to sensing E1, E2 and to detect capacitance or changes in capacitance between sensing electrodes E1, E2 and ground or another reference potential, as would be understood by one skilled in the art. Control circuit 16 also could be adapted to use the foregoing capacitance data to deem whether either or both of sensing electrodes E1, E2 is in a so-called "touched" state. For example, control circuit 16 could be adapted to deem sensing electrode E1 or E2 to be in a touched state when the capacitance to ground at the sensing electrode is at an elevated state for at least a predetermined length of time. This condition could occur when a user's hand or finger or other object is proximate the respective sensing electrode for at least a predetermined length of time, as might be the case when such an object is near or in contact with the surface of door handle 10 behind which the respective sensing electrode is disposed. The predetermined length of time could be as short as instantaneous or of a greater length suitable for the application and the sensing technology employed, as would be understood by one skilled in the art. For example, in embodiments using capacitive sensing technology, the predetermined length of time might be on the order of several milliseconds to ten or more seconds. In embodiments using field effect sensing technology, as discussed further below, the predetermined length of time could be substantially indefinite or unlimited.

Control circuit 16 also could be adapted to provide an output indicative of whether the control circuit deems either or both of sensing electrodes E1, E2 to be in a touched state and the manner in which the sensing electrode(s) came to be in the touched state, as will be discussed further below. The outputs of control circuit 16 could be used directly or via an intervening controller (for example, LIN controller 22 shown in FIG. 6) to perform any desired function. Indeed, sensing electrodes E1, E2 and the control circuit could be used together to control multiple functions.

Figure 3A:
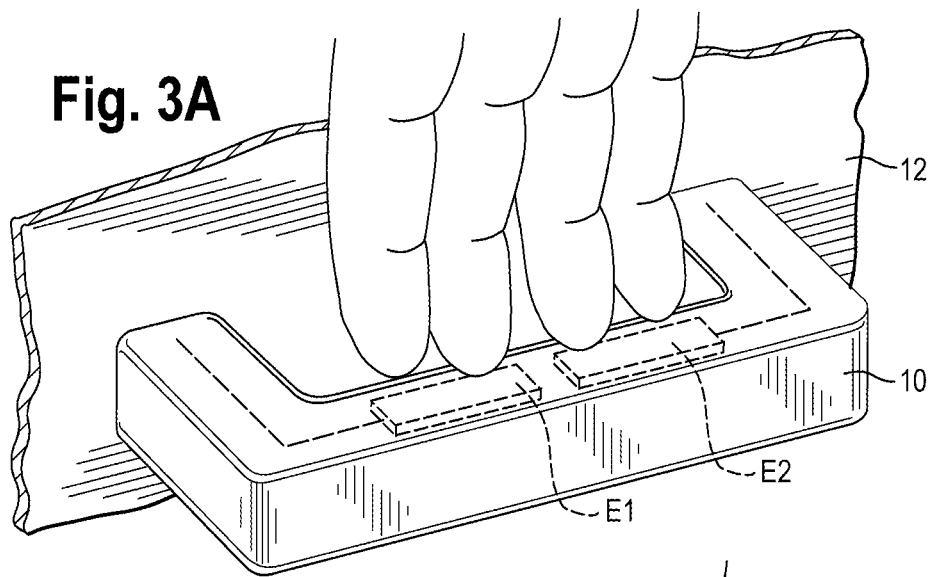
FIG. 3A is a perspective view of a door handle 10 and a user's hand approaching the door handle as if to grasp the door handle.

In an illustrative embodiment, control circuit 16 could provide a first output when the control circuit deems either or both (preferably both) of sensing electrodes E1, E2 to be in the touched state for at least a predetermined length of time. For example, as shown in FIG. 3A, control circuit 16 could provide a first output causing a door lock to change from the locked state to the unlocked state (or to remain in the unlocked state if already in the unlocked state) and/or cause a door latch to release in response to proximity of an object or objects to door handle 10 near either or both (preferably both) of sensing electrodes E1, E2 for at least a predetermined time, as might occur when a user grasps door handle 10 in order to open a door 12 that door handle 10 is attached to. The predetermined time could be as short as instantaneous or of greater length, as discussed above. In one embodiment, the predetermined time could be about 30-50 msec.

Figure 3B:
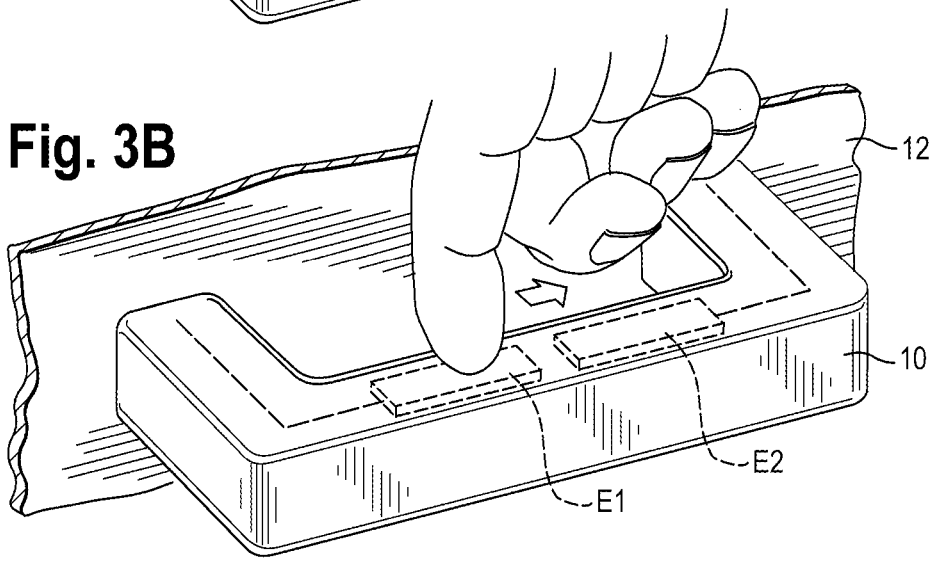
FIG. 3B is a perspective view of a door handle 10 and a user's finger sliding across an upper surface of the door handle.

Control circuit 16 could provide a second output when the control circuit first deems sensing electrode E1 but not sensing electrode E2 to be in the touched state for at least a predetermined time and then, within a predetermined window of time, deems sensing electrode E2 but not sensing electrode E1 to be in the touched state. For example, as shown in FIG. 3B, the control circuit 16 could cause the door lock to change from the unlocked state to the locked state in response to proximity of an object to door handle 10 near sensing electrode E1 but not near sensing electrode E2 and then, within a predetermined window of time, proximity of an object to door handle 10 near sensing electrode E2 but not near sensing electrode E1, as might occur when a user slides a finger or hand across a surface of door handle 10 behind which sensing electrodes E1, E2 are disposed. The predetermined time could be as short as instantaneous or of a greater length, as discussed above. The predetermined window of time could open at any desired time after control circuit 16 deems sensing electrode E1 but not sensing electrode E2 to be in a touched state and could have any desired duration. In one embodiment, the predetermined window of time could open 15 msec after sensing electrode E1 senses proximity of the object and close 50 msec later.

Control circuit 16 could provide a third output when the control circuit first deems sensing electrode E2 but not sensing electrode E1 to be in the touched state for at least a predetermined time and then, within a predetermined window of time, deems sensing electrode E1 but not sensing electrode E2 to be in the touched state. For example, control circuit 16 could cause the door lock to change from the locked state to the unlocked state without unlatching the door in response to proximity of an object to door handle 10 near sensing electrode E2 but not near sensing electrode E1 and then, within a predetermined window of time, proximity of an object to door handle 10 near sensing electrode E1 but not near sensing electrode E2, as might occur when a user slides a finger or hand across a surface of door handle 10 behind which sensing electrodes E1, E2 are disposed. The predetermined time could be as short as instantaneous or of a greater length, as discussed above. The predetermined window of time could open at any desired time after control circuit 16 deems sensing electrode E2 but not sensing electrode E1 to be in a touched state and could have any desired duration, as discussed above.

In other embodiments, grasping or swiping door handle 10 could have other effects. For example, grasping the door handle could cause the door lock to change to a locked state (or to remain in the locked state if already in the locked state), and swiping the handle could cause unlocking and/or unlatching. Alternatively or additionally, grasping or swiping door handle 10 could cause vehicle lights to turn on or off, cause a door or hatch to open or close, or cause other effects.

Control circuit 16 could be adapted to distinguish between a bona fide touch event, for example, a deliberate and intentional touch by a user to door handle 10 proximate a sensing electrode Ex, and a spurious touch event, for example, the presence of pooled water or another contaminant in proximity to the sensing electrode $E_x$. Control circuit 16 further could be adapted to deem a sensing electrode Ex to be in a touched state only in response to a bona fide touch event and, therefore, provide the foregoing outputs only in response to bona fide touch events.

For example, control circuit 16 could be adapted to determine a multi-sample running average capacitance to ground or other reference potential at each sensing electrode Ex by periodically sampling the capacitance at the sensing electrode Ex, summing the capacitances obtained from the previous y number of samples, and dividing by y. In an illustrative embodiment, y might equal 500 and the sampling period might equal 10 milliseconds. In other embodiments, y could have a greater or lesser value and the sampling period could be longer or shorter. Control circuit 16 could be adapted to deem the sensing electrode Ex to be in the touched state only when the current capacitance at that sensing electrode exceeds the current multi-sample running average by at least a predetermined threshold amount. In an illustrative embodiment wherein control circuit 16 is embodied as a Cypress PSOC, this threshold amount could be equal to, for example, 100 raw counts, as would be understood by one skilled in the art. In other embodiments, this threshold amount could have a greater or lesser value that might be selected as a function of the sensitivity and scale of the sensing electrodes.

The foregoing scheme for distinguishing between bona fide and spurious touch events could be used in connection with a multi-function sensor having only two sensing electrodes E1, E2, for example, as illustrated in FIG. 1A-1B. One skilled in the art would recognize, however, that such an embodiment might be more sensitive to rain and water spray than desired. The performance of a multi-function sensor apparatus implementing the foregoing scheme could be enhanced by the inclusion of more than two sensing electrodes and/or the use of sensing electrodes of certain shapes.

Figure 4:
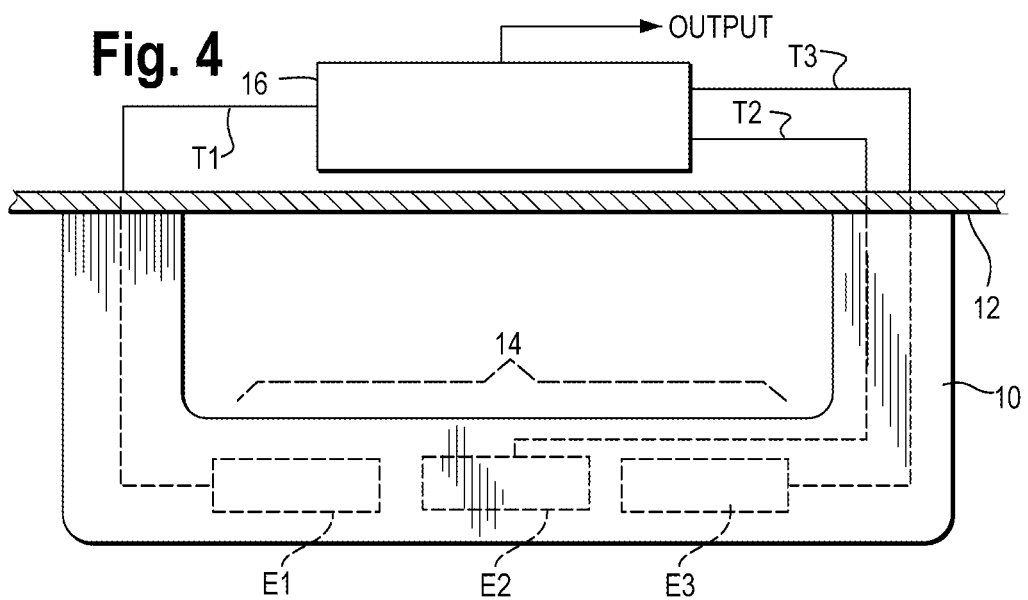
FIG. 4 is a plan view of a door handle 10 mounted on a vehicle door 12 and an array 14 of sensing electrodes E1, E2, E3 disposed within door handle 10.
Figure 5:
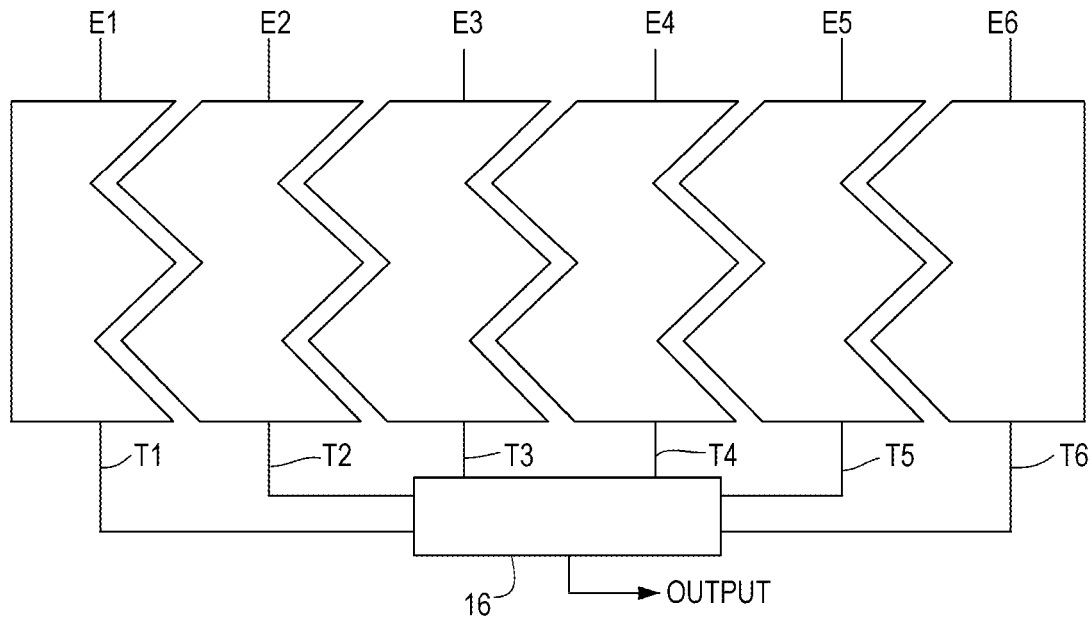
FIG. 5 is a plan view of an array 14 of sensing electrodes E1-E6.
Figure 6:
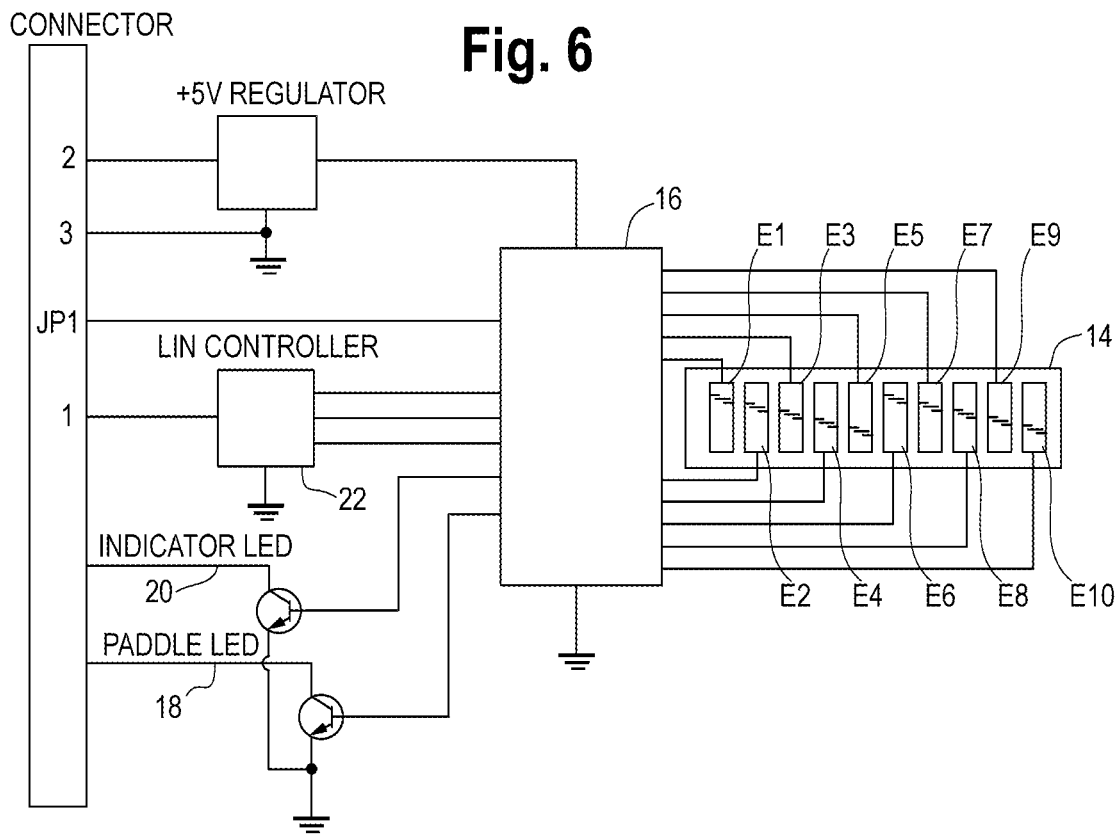
FIG. 6 is a schematic diagram of a multi-function sensor apparatus including an array 14 of sensing electrodes E1-E10 and a control circuit 16.

In this regard, FIG. 4 illustrates a multi-function sensor apparatus including an array 14 of three rectangular sensing electrodes E1-E3 disposed in a door handle 10 and a control circuit 16 adapted to receive and process signals from each of sensing electrodes E1-E3. FIG. 5 illustrates an embodiment of a multi-function sensor apparatus including six zigzag shaped sensing electrodes E1-E6 and a control circuit 16 adapted to receive and process signals from each of sensing electrodes E1-E6. FIG. 6 illustrates an embodiment of a multi-function sensor apparatus including ten sensing electrodes E1-E10 and a control circuit 16 adapted to receive and process signals from each of sensing electrodes E1-E10. Other embodiments could include more or fewer sensing electrodes E1-En of any desired shape and a control circuit 16 adapted for use therewith. Any or all of sensing electrodes E1-En could be disposed on or within door handle 10 as set forth above. Although FIGS. 4-6 illustrate sensing electrodes E1-En being arranged in linear arrays, the arrays could have curved or other shapes as might be desired for a particular application.

In embodiments including three sensing electrodes E1-E3, control circuit 16 could be adapted to provide a first output, for example, a door unlock and unlatch signal, in response to the control circuit deeming any two of sensing electrodes E1-E3 to be in a touched state for at least a predetermined time. Control circuit 16 also could be adapted to provide a second output, for example, a door lock signal, in response to the control circuit deeming two of the three sensing electrodes E1-E3 to be in touched states in a first predetermined sequence within a predetermined time window, as discussed above. Control circuit 16 further could be adapted to provide a third output, for example, a door unlock but not unlatch signal, in response to the control circuit deeming two of the three sensing electrodes E1-E3 to be in touched states in a second predetermined sequence within a predetermined time window. Control circuit 16 could be adapted to provide other outputs in response to these or other inputs, as well. The foregoing predetermined time, sequences, and time windows could be selected as desired. The first sequence typically, but not necessarily, would correspond to the path followed by a user's swipe of door handle 10 in a first direction, as shown, for example, in FIG. 3B. The second sequence typically, but not necessarily, would correspond to the path followed by a user's swipe of door handle 10 in a second, for example, opposite, direction.

In embodiments including more than three sensing electrodes E1-En, control circuit 16 could be adapted to provide a first output, for example, an unlock and unlatch signal, in response to the control circuit deeming at least some of (for example, any three of six or five of ten) sensing electrodes E1-En to be in the touched state for at least a predetermined time, as discussed above. Control circuit 16 also could be adapted to provide a second output, for example, a door lock signal, in response to the control circuit deeming at least some of (for example, any three of six or five of ten) sensing electrodes E1-$E_n$ to be in touched states in a predetermined sequence within a predetermined time window, as discussed above. Control circuit 16 further could be adapted to provide a third output, for example, a door unlock but not unlatch signal, in response to the control circuit deeming at least some of (for example, any three of six or five of ten) sensing electrodes E1-$E_n$ to be in touched states in another predetermined sequence within a predetermined time window, as discussed above. Control circuit 16 could be adapted to provide other outputs in response to these or other inputs, as well. The foregoing predetermined time, sequences, and time windows could be selected as desired. The first sequence typically, but not necessarily, would correspond to the path followed by a user's swipe of door handle 10 in a first direction as shown, for example, in FIG. 3B. The second sequence typically, but not necessarily, would correspond to the path followed by a user's swipe of door handle 10 in a second, for example, opposite, direction.

A multi-function sensor apparatus could further include miscellaneous peripheral electronic components, additional sensing electrodes (for example, a sensor for "waking up" the foregoing sensors and control circuit from a "sleep" mode), guard electrodes separating sensing electrodes E1-En from each other and/or other electrodes and/or an RF key fob antenna, a carrier (for example, a printed wiring board, a flexible circuit carrier, or other plastic or glass substrate) for the electrodes and/or electronics, a cable/connector, and an adhesive or other means to adhere the multi-function sensor apparatus or components thereof to the door handle assembly. The adhesive could be eliminated if the sensor assembly were insert molded into, or snap fit, press fit, heat staked, or otherwise attached to, the handle assembly.

Sensing electrodes E1-En have been described thus far as a form of capacitive sensor. In alternate embodiments, sensing electrodes E1-En could be embodied as field effect sensors, for example, field effect sensors as disclosed in U.S. Pat. No. 6,320,282, assigned to TouchSensor Technologies, LLC of Wheaton, Ill., and/or field effect sensors marketed by TouchSensor under the TouchCell mark incorporating a TouchSensor TS100 integrated circuit.

A multi-function sensor apparatus could be used in connection with a passive, keyless entry, automotive access system. In such a system, a user carries a key fob or other device that participates in an RF signal interaction with the vehicle's security system when within a certain range of the vehicle. As the user (in possession of the fob) approaches the vehicle, the security system, through the RF signal interaction, recognizes the user as authorized to access the vehicle. The security system might, but need not, then unlock the vehicle. If not, the user could operate the multi-function sensor apparatus to unlock the vehicle as set forth above.

Door handle 10 is shown as a conventional handle that could be grasped by a user. Door handle 10 could be embodied in other ways, as well. For example, door handle 10 could be embodied as a hinged, paddle-type handle and sensing electrodes E1-En could be disposed behind the surface or surfaces that could be touched by the user's fingers. Alternatively, door handle 10 could be omitted and sensing electrodes E1-En could be disposed within or on a lip in the vehicle body or trim under which a user could place a finger or fingers to pull the door. Such "pull" structure could be omitted in embodiments including a mechanism for opening the door in response to an unlatch signal. Such a mechanism could be embodied, for example, as a spring loaded door latch that would pop the door open, allowing the user to grab the door edge and pull the door open, or as a motor for opening the door. Door handle 10 (or the foregoing alternative structure) could be mounted on a passenger door, lift gate, hatch, tailgate, or elsewhere on the vehicle.

The multi-function sensor apparatus described above can be operated using a light touch, without application of pressure required. As such, tactile or other feedback confirming actuation of the apparatus might not be inherently provided. Lighting or means for providing haptic feedback could be included to indicate that a function has been performed and/or to indicate which function has been performed. Also, lighting could be provided to light the area about door handle 10. In this regard, FIG. 5 illustrates a paddle LED 18 for lighting the area about door handle 10 and an indicator LED 20 for providing visual indication of the status of the lock mechanism, visual confirmation that the lock mechanism has been actuated, visual confirmation that control circuit 16 has deemed one or more of sensing electrodes E1-En to be in the touched state, and/or other information.

The foregoing structures and techniques could be used in non-automotive and non-access control applications, as well. Indeed, the multi-function sensor apparatus could be used in a wide variety of applications to control a wide variety of functions, as would be recognized by one skilled in the art.

Certain illustrative embodiments of a multi-function sensor apparatus are disclosed herein. One skilled in the art would recognize that these embodiments could be modified without departing from the scope of the invention as set forth in the following claims. As such, the embodiments disclosed herein should not be deemed to limit the scope of the invention as claimed.

The invention claimed is:

1. A multi-function sensor apparatus comprising:
a first sensing electrode;
a second sensing electrode; and
a control circuit configured to:
receive signals from said first sensing electrode;
receive signals from said second sensing electrode;
deem whether said first sensing electrode is in a touched state;
deem whether said second sensing electrode is in a touched state; and
provide an output having:
a first state when said control circuit deems fewer than both of said first and said second sensing electrodes to be in a touched state;
a second state when said control circuit deems both of said first and said second sensing electrodes to be in a touched state simultaneously for at least a predetermined period of time, and
a third state when said control circuit deems one of said first and said second sensing electrodes to be in a touched state and then, after the expiration of a second predetermined period of time but before the expiration of a third predetermined period of time, deems the other of said first and said second sensing electrodes to be in a touched state.

2. The multi-function sensor apparatus or claim 1 wherein said control circuit periodically receives signals from said first sensing electrode and deems said first sensing electrode to be in a touched state when a value corresponding to a signal received from said first sensing electrode exceeds the average of values corresponding to a predetermined previous number of signals received from said first sensing electrode by a predetermined threshold amount.

3. The multi-function sensor apparatus of claim 1 wherein said first sensing electrode and said second sensing electrode are disposed within or on a substrate.

4. The multi-function sensor apparatus of claim 3 wherein said substrate comprises a door handle.

5. A multi-function sensor apparatus comprising:
n sensing electrodes, wherein n is greater than or equal to three; and
a control circuit configured to:
receive signals from said first sensing electrode;
receive signals from said second sensing electrode;
deem whether said first sensing electrode is in a touched state;
deem whether said second sensing electrode is in a touched state; and
provide an output having:
a first state when said control circuit deems at least some of said n sensing electrodes to be in a touched state for at least a predetermined time;
a second state when said control circuit deems at least some of said n sensing electrodes to be in a touched state in a predetermined sequence within a predetermined time window; and
a third state when said control circuit deems at least some of said n sensing electrodes to be in a touched state in another predetermined sequence within a predetermined time window.

6. The multi-function sensor apparatus of claim 5 wherein said n sensing electrodes are arranged sequentially on or behind a surface in a pattern defining a path that readily can be traced by a user's finger or other object without departure from said surface and without crossing said path.

7. The multi-function sensor apparatus of claim 6 wherein said path is substantially continuous.

8. The multi-function sensor apparatus of claim 6 wherein at least a portion of said path is substantially linear.

9. The multi-function sensor apparatus of claim 6 wherein at least a portion of said path is curved.

10. The multi-function sensor apparatus of claim 5 wherein said control circuit periodically receives signals from each of said n sensing electrodes and deems each of said respective sensing electrodes to be in a touched state when a value corresponding to a signal received from said respective sensing electrode exceeds the average of values corresponding to a predetermined previous number of signals received from said respective sensing electrode by a predetermined threshold amount.

* * * * *